United States Patent [19]

Boudon et al.

[11] Patent Number: 5,010,257
[45] Date of Patent: Apr. 23, 1991

[54] BICMOS LOGIC CIRCUIT WITH FULL SWING OPERATION

[75] Inventors: Gerard Boudon, Mennecy; Pierre Mollier, Boissise Le Roi; Jean-Paul Nuez, Savigny Sur Orge; Ieng Ong, Antony; Pascal Tannhof, Perthes; Franck Wallart, Cesson, all of France

[73] Assignee: International Business Machines Corporation, Armonk, N.Y.

[21] Appl. No.: 493,014

[22] Filed: Mar. 13, 1990

[30] Foreign Application Priority Data

Mar. 14, 1989 [EP] European Pat. Off. ........ 89480044.0

[51] Int. Cl.⁵ .................. H03K 19/02; H03K 19/094; H03K 3/01
[52] U.S. Cl. .................................... 307/446; 307/450; 307/451; 307/482; 307/570; 307/296.3
[58] Field of Search ................ 307/443, 446, 450-451, 307/542, 546, 482, 570, 296.3

[56] References Cited

U.S. PATENT DOCUMENTS 4,616,146 10/1986 Lee et al. ........................... 307/446
4,926,069 5/1990 Yamazaki ............................ 307/570

FOREIGN PATENT DOCUMENTS 0058958 1/1982 European Pat. Off. .
0254786 3/1988 European Pat. Off. .
0318624 6/1989 European Pat. Off. ............ 307/446
89480044 11/1989 European Pat. Off. .

OTHER PUBLICATIONS

Patent Abstracts of Japan, vol. 9, No. 69 (E-305) (1972).

Primary Examiner—Stanley D. Miller
Assistant Examiner—Margaret R. Wambach
Attorney, Agent, or Firm—Jeffrey L. Brandt; Otho B. Ross

[57] ABSTRACT

According to the present invention, a CMOS interface circuit (C2) similar to a latch made by two CMOS cross coupled inverters (INV1, INV2) is placed directly on the output node (14) of conventional BICMOS logic circuit (11) operating alone in a partial swing mode. This latch is made of four FETs P5, P6, N8, N9 cross-coupled in a conventional way with the feedback loop connected to said output node (14). The partial voltage swing (VBE to VH-VBE) naturally given by the output bipolar transistors (T1, T2) mounted in a push pull configuration is reinforced to full swing (GND to VH) by the latch at the end of each transition. The state of the output node if forced by the latch because of the high driving capability due to the presence of said output bipolar transistors (T1, T2). As a result, the improved BICMOS logic circuit (D2) has an output signal (S) that ranges within the desired full swing voltage at the output terminal (15). It is a characteristic of this embodiment that the structure of CMOS interface (C2) is always independent of the logic function implemented in the conventional BICMOS logic circuit (11). More generally, the CMOS interface circuit may have various physical implementations, however, it is always comprised of CMOS FETs and it becomes active at least in one of the GND to VBE or (VH−BE) to VH range.

13 Claims, 5 Drawing Sheets

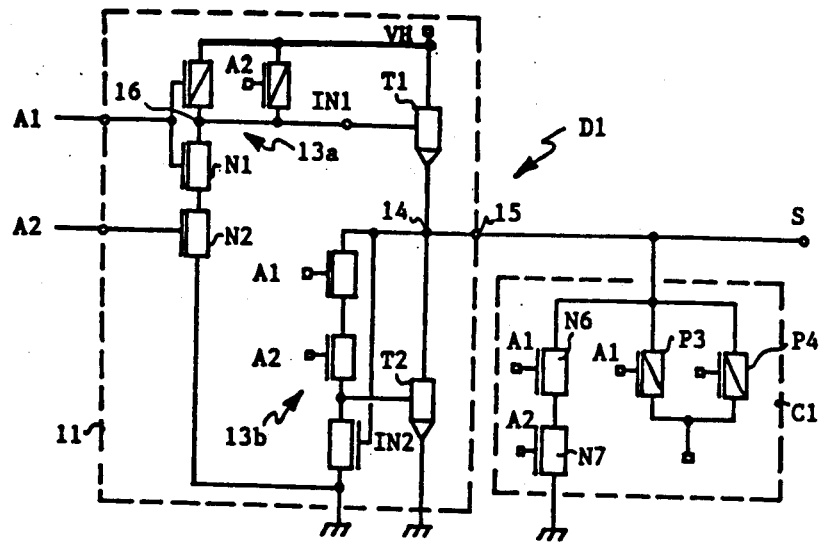
FIG. 5
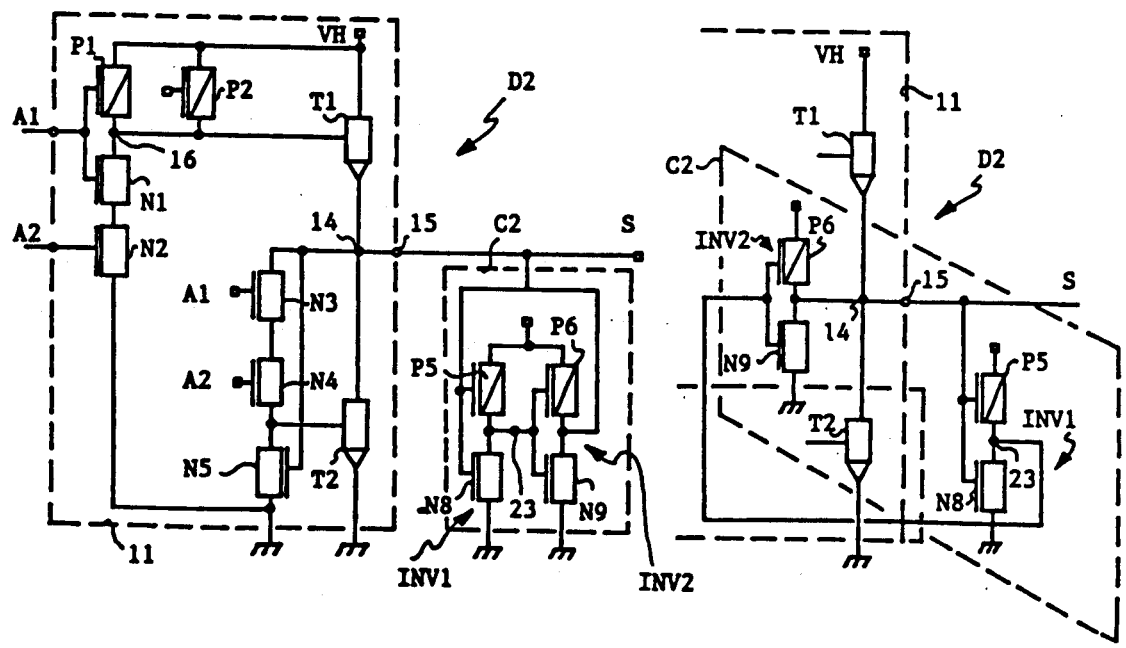 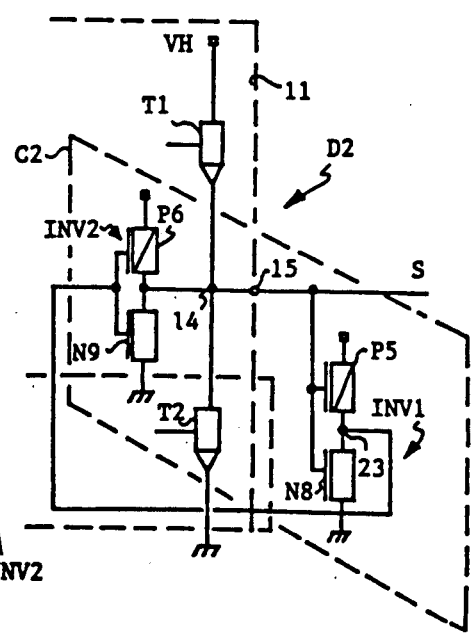
FIG. 6A    FIG. 6B

BICMOS LOGIC CIRCUIT WITH FULL SWING OPERATION

The present invention relates to BICMOS logic circuits and more particularly to a circuit improvement which allows a full swing operation. The full swing is important to minimize power consumption and to increase speed in a BICMOS/CMOS circuit environment when CMOS FETs having threshold voltages (VTs) less than a base-emitter voltage (VBE) of bipolar transistors are used.

A typical BICMOS logic circuit generally comprises two different stages: a first stage consisting of CMOS FETs to achieve the desired logic function, and a second stage, including at least one bipolar transistor to operate as the output driving stage. Bipolar transistors are appreciated for their ability to supply higher currents than FETs in same operating conditions, they also require less space and exhibit lower input capacitance in that context. On the other hand, FETs are used in the first stage to perform the desired logic function because of their superior integration density when no power is required and also their better logic efficiency.

FIG. 1 shows a conventional BICMOS logic circuit arrangement 10 comprised of two identical BICMOS logic circuits 11 and 11.1 which are connected in series. As explained above, logic circuit 11 consists of two stages implemented respectively with a driving block 12 and a logic gate block 13. In the driving block 12, two NPN bipolar output transistors T1 and T2 are connected in a totem pole configuration with a common output node 14 coupled therebetween. Transistors T1 and T2 are biased between a first supply voltage: a positive voltage VH and a second supply voltage: the ground GND. Transistors T1 and T2 are respectively mounted in a emitter follower and in common emitter amplifier configurations. Transistor T1 is often referred to as the pull up transistor, since when it is conductive, the output signal S1 at terminal 15 (same potential as node 14) is pulled up to VH (minus one VBE). Similarly, transistor T2 is referred to as the pull down transistor, because when it is conductive, the output signal is pulled down to GND (plus one VBE).

Two parts may be distinguished in logic GATE block 13. First of all, an upper part 13a comprised of FETs: P1, P2, N1 and N2 connected in a two input NAND configuration between VH and GND. This upper part is also called the pull up logic because its output at node 16 is connected to the base of pull up transistor T1. Secondly, a lower part 13b which essentially consists of two NFETs N3 and N4 connected in series between the output node 14 and the base of pull down transistor T2 to achieve the corresponding NAND function. Optionally, as represented in FIG. 1, an additional FET N5 is connected between the common connection of FET N4 and the base of T1 referenced as node 17, and the ground GND. FET N5 has its gate electrode connected to node 14 and is, therefore, controlled by the output signal S1. It aims to increase the switching speed of transistor T2. Logic input signals A1 and A2 are respectively applied to logic circuit 11 at terminals 18 and 19 and then appropriately conveyed to respective FETs. Circuit output signal S1 achieves the logic NAND of input signals A1 and A2.

Similar construction applies to BICMOS logic circuit 11.1 comprised of driving block 12.1 and logic gate block 13.1, so that output signal S3 is the logic NAND of signals S1 (supplied by circuit 11) and S2 (supplied by another logic circuit, not shown in FIG. 1). Corresponding elements bear corresponding references.

Briefly stated, DC operation of circuit 11 is as follows, assuming that full swing input signals, are applied. If at least one input signal (e.g. A1) is at the low level (potential of GND=0 V), at least one of the PFETs P1 and P2 is conductive. As a result, voltage VH is applied on the base of transistor T1 which is rendered conductive and clamps the potential of node 14 at VH-VBE. Transistor T2 is non conductive, since the electrical path which connects its base to node 14 at the potential of VH-VBE is cut off, because NFETs N3 and N4 are OFF. On the contrary, if both input signals A1 and A2 are at the high level (potential of VH), transistor T2 is in the ON state and clamps node 14 at the potential of one VBE above the ground, because base and collector of transistor T2 are connected by two conductive NFETs N3 and N4; in the meantime, transistor T1 is maintained non conductive. Consequently, the circuit output signal S1 ranges from VBE to (VH-VBE).

It is clear that no power is consumed in the quiescent state in both stages. In the logic block, this results directly from the use of CMOSFETs. In the driving block, this results of the push pull construction of transistors T1 and T2, so that when transistor T1 is ON, transistor T2 is OFF, and vice versa.

To achieve this zero power consumption, it is obvious that no cross over current ICO flows through output transistors T1 and T2 in the quiescent state if we assume that sub threshold and leakage currents are negligible. This condition implies that threshold voltages (VTs) of FETs are sufficient, as demonstrated hereafter. This condition as to adequate VTs is raised because unfortunately, circuits 11 and 11.1 do not operate in full swing mode. The logic voltage swing of output signal S1 shown by curve 20 in FIG. 2 is between VBE and VH-VBE as explained above. Inconveniences which result therefrom may be clearly understood from the operation of circuit 11.1 in FIG. 1. If logic output signal S1 supplied by circuit 11 is at a low level (logic "0"), the potential which is applied on gate of FETs P1.1 and P2.1 is about 0.8 V (corresponding to one VBE), which makes these PFETs conductive and conversely, is supposed to make NFETs N1.1 and N2.1 non conductive. The latter statement is true only if the voltage threshold VTN of NFETs is greater than 0.8 V. Same reasoning applies when output signal S1 is at a high level (logic "1"), say at VH-VBE, so that VTP must be ≧0.8 V. If these conditions are not respected, the PFET and NFET devices will conduct, which in turn, result in power consumption. Therefore to have minimum power consumption imposes VTs of FETs ≧ |0.8 V| and preferably, in the range of 0.8 V. However, the present trend is towards greater integration and better performances of devices and also improved technologies, which makes necessary the use of low VT transistors, i.e. with VTs in the range of 0.5 V or less.

Accordingly, there is a serious problem when BICMOS logic circuits not operating in the full swing mode have to drive either BICMOS or CMOS logic circuits. BICMOS logic circuits with full CMOS level swing (OV to VH) are highly desirable, to achieve compatibility with CMOS circuits. Should a BICMOS logic circuit with full CMOS level swing drive a CMOS circuit, the latter would not dissipate DC power. In addition, the CMOS circuit may then use high VT FET devices for improved operation. On the other hand, when a BICMOS logic circuit with full CMOS level swing drives a BICMOS circuit, it allows the latter to have low VT transistors in the CMOS part, thus permitting that higher circuit speeds be obtained owing to the use of low VT transistors.

This problem is clearly identified in the U.S. Pat. No. 4,682,054 assigned to Motorola, and issued on July 21, 1987. The solution given therein may be understood from FIG. 3 of the present application. A BICMOS logic circuit 21 designed to operate as a driver circuit includes a logic gate block consisting of a CMOS inverter 13' comprised of two complementary FETs P'1 and N'1 connected in series between VH and GND with a common node 16' coupled therebetween. Circuit 21 further includes a driving block comprised of a pull up NPN transistor Q'1 and a pull down PNP transistor Q'2 connected in a push pull configuration with a common output node 14' coupled therebetween. The gates of FETs P'1 and N'1 are tied together and operative to receive logic input signal A'. The output signal of the CMOS inverter at node 16' is supplied to the bases of bipolar transistors Q'1 and Q'2. The circuit output signal S' is available at potential). According to this disclosure, a passive element, e.g. a resistor R' (or a resistively connected FET) is connected between nodes 14' and 16'. The resistor allows a full swing voltage be obtained in the circuit output signal S' as shown by curve 22 n FIG. 4. If FET P'1 is conductive, node 16' is raised to VH, transistor Q'1 is ON and the capacitive load CL is charged until the potential at terminal 15' is equal to VH-VBE. Thanks to the action of resistor R', capacitive load CL is charged further to reach VH through FET P'1, simultaneously transistor Q'1 is rendered non conductive. This last step of charge is relatively show, but the full swing is obtained. As previously mentioned, the advantage of having full swing is to accept low VTs transistors for higher speeds for BICMOS/CMOS circuits. But, in the present case this is achieved at the expense of various inconveniences. First of all, due to its construction, circuit 21 necessarily implies the use of a complementary pair of bipolar transistors (NPN pull up/PNP pull down). It also implies power consumption in the transients because of the use of a passive element, say resistor R'. During transients, a part of the current supplied by the conductive one of FETs is derived through the resistor R' to the output node, instead of feeding the base nodes of bipolar transistors. This current is then unusefully lost till the VBE of the one bipolar transistor that is rendered conductive, is greater than 0.8 V. As a fact, this resistor R' slows down conduction of output bipolar transistors, because the CMOS part is not only loaded by the bipolar transistors but also by the said resistor.

Accordingly, it is a primary object of the present invention to provide improved BICMOS logic circuits capable of providing a full swing output voltage for CMOS compatibility which overcome all inconveniences of the prior art circuits.

It is another object of the present invention to provide improved BICMOS logic circuits with full swing output voltage which allow usage of low VT transistors for increased speed in BICMOS/CMOS logic circuits.

It is still another object of the present invention to provide improved BICMOS logic circuits with full swing output voltage which allow any combination of bipolar and bipolar/unipolar devices in the driving block.

It is still further object of the present invention to provide improved BICMOS logic circuits with full swing output voltage which allow any logical function, e.g. NAND, NOR, INVERT, ... to be implemented in the logic gate block.

These and others objects of the present invention are accomplished by a BICMOS/CMOS level interface circuit comprised of active CMOSFETs, said circuit being connected to the output node of the BICMOS logic circuit, to force it to full swing between VH and GND. According to a first embodiment, the interface circuit essentially consists of the same logic circuit that exists in the upper part of the logic gate block and is driven by the same logic input signals. According to a second embodiment, the interface circuit essentially consists of two cross-coupled inverters forming a latch. Although different implementations are possible, they all aim to filling the same technical function. Due to its construction, the BICMOS/CMOS level interface circuit has to be operative, in the (VH-VBE) to VH and in the GND to VBE ranges respectively at the high and low levels. It ensures the full swing is obtained by pulling up (down) the output node to VH (GND). It could be irrelevant to have the interface circuit be operative, in the VBE to (VH-VBE) central range, as does the BICMOS logic circuit. According to the present invention however, the interface circuit is preferably operative in that range, to help the BICMOS logic circuit to run faster. It is a first feature of the present invention, that dynamic elements such as active NFETs and PFETs, are used in the interface circuit instead of using passive elements such as resistors. It is a second feature of the present invention, that the BICMOS/CMOS level interface circuit is placed at the output node of the BICMOS logic circuit. As a first result, the speed and power consumption of the BICMOS logic circuit are improved, while offering the additional capability of interfacing with CMOS/BICMOS logic circuits. As a second result, the invention may be applied to any BICMOS logic circuit, whatever the type of the logic gate block or the driving block is.

The novel features believed to be characteristic of this invention are set forth in the appended claims. The invention itself, however, as well as other objects and advantages thereof, may best be understood by reference to the following detailed description of illustrated preferred embodiments, read in conjunction with the accompanying drawings in which:

FIG. 5 illustrates a conventional BICMOS circuit provided with the interface circuit of the present invention according to a first embodiment.

FIG. 6A illustrates a conventional BICMOS circuit provided with the interface circuit of the present invention according to a second embodiment.

FIG. 6B illustrates a different representation of the circuit of FIG. 6A.

Figure 1:
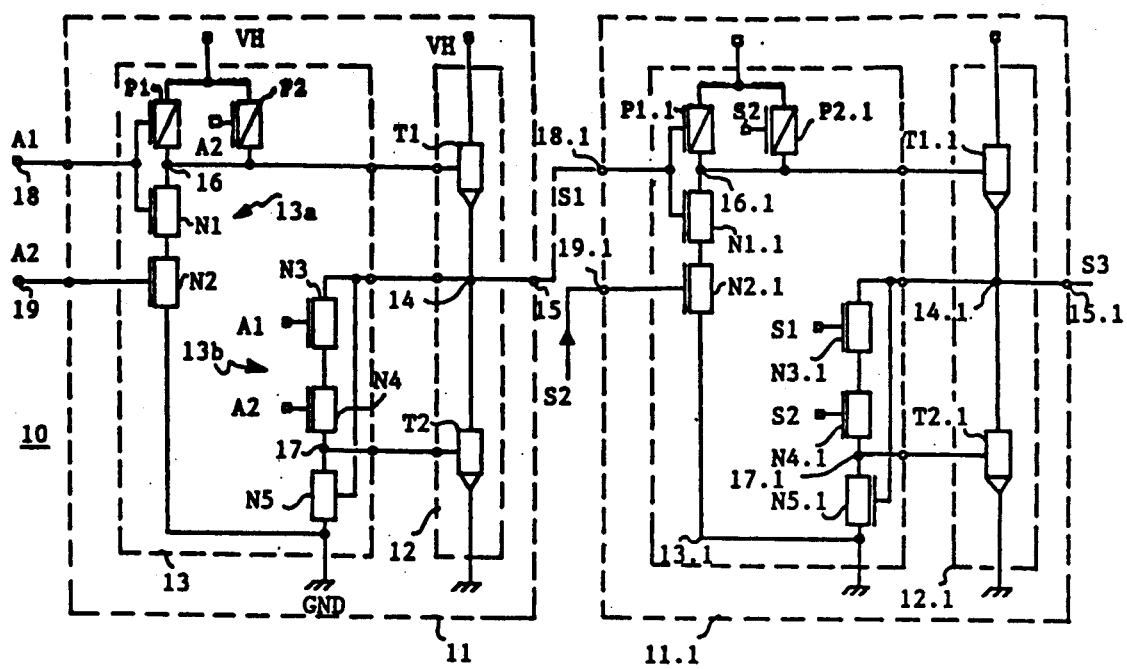
FIG. 1 illustrates a schematic diagram of a typical BICMOS logic arrangement comprised of two identical and conventional BICMOS logic circuits.
Figure 2:
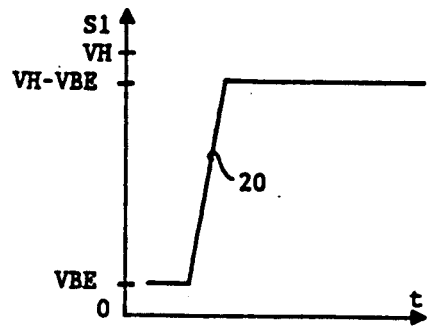
FIG. 2 illustrates the typical partial voltage swing wave-form of the output signal supplied by the circuits of FIG. 1.
Figure 4:
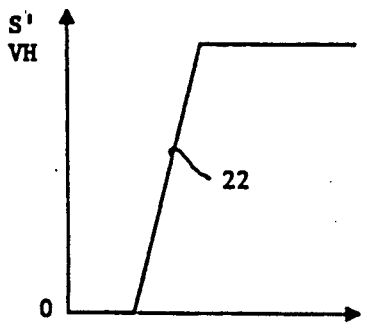
FIG. 4 illustrates the typical full swing waveform of the output signal supplied by the circuit of FIG. 3.
Figure 3:
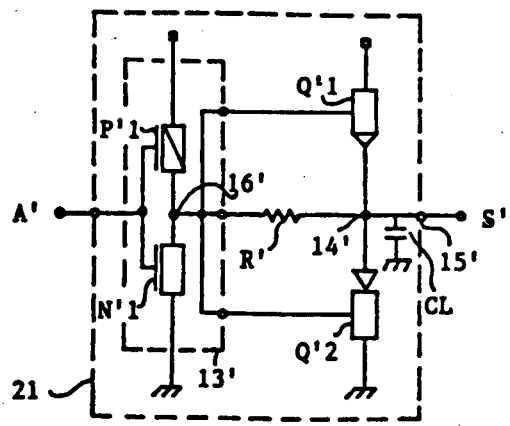
FIG. 3 illustrates an improved BICMOS circuit of the prior art which supplies a full swing voltage at the circuit output terminal.

The BICMOS/CMOS interface circuit C of the present invention has various physical implementations. In a first embodiment of the present invention, shown in FIG. 5, an interface circuit C1 which performs the same logic function as the BICMOS circuit, say a NAND function, is connected to terminal 15 (at the same potential as the output node 14) of circuit 11. The interface circuit C1 comprises four FETs, two NFETs: N6, N7 and two PFETs: P3, P4. With the particular construction of circuit 11 shown in FIG. 1, these FETs are connected to provide the same NAND logic function that is achieved in the front part or upper part 13a of logic gate block 13 by devices P1, P2 and N1, N2.

It is clear that interface circuit C1 working alone would force the potential at terminal 15 to the full swing. But when placed in parallel on the output of BICMOS logic circuit 11, it will not also force the circuit output signal to the full swing, but it will also operate efficiently in the GND to VBE and (VH-VBE) to VH ranges. In the remaining central range, the speed of the circuit output signal S is ensured by the output bipolar transistors. It is typical of this embodiment to have two identical logic circuits performing the same logic function connected in parallel, the first (13a) at the output at the base node 16 of transistor T1 and the other (C1) at the output node 14 of the BICMOS logic circuit. Both circuits are isolated by transistor T1 connected in an emitter-follower configuration. The BICMOS logic circuit 11 still provides the desired high load driving capability while the interface circuit C1 gives the full voltage swing required for CMOS/BICMOS compatibility. The result is an improved BICMOS circuit, D1 formed by the combination of circuit 11 and interface circuit C1, both having outstanding qualities.

This approach is insensitive to timing between signals and gives the best delays for the BICMOS circuit families with low VT transistors. This approach will be preferred for single logic functions, say for the Inverter/Buffer type of circuits. However, if this circuit improvement ensures optimal performance of the improved BICMOS circuit D1, this is done at the expense of adding supplemental FETs in the interface circuit, and the number of FETs can be prohibitive if the number of logic input signals (A1, A2, ... ) is above two.

According to a second embodiment of the present invention, another construction which also permits the desired full swing voltage at the output is shown in FIG. 6A. An interface circuit C2 similar to a latch, made by two CMOS cross coupled inverters INV1 and INV2, is placed directly on the output node of the BICMOS circuit 11, with its feedback loop connected to the said node. This latch is made of four FETs P5, P6, N8, N9 cross-coupled in a conventional way to form the said inverters with a common node 23 coupled therebetween. The state of the circuit output signal: high or low is forced by the BICMOS logic circuit because it has a higher driving capability due to the output bipolar transistors. The limited or partial voltage swing given by the bipolar transistors is reinforced to full swing by the latch at the end of each transition. Because FETs P6 and N9 are connected to VH and GND, when they are conductive, they ensure that the output node raises to VH and GND, respectively at the end of the transients. Because a part of the collector current of transistor T2 or emitter current of transistor T1 is derived in the latch to set it in its opposite state, this embodiment is less efficient than the previous one. However, it is an advantage that the structure of interface circuit C2 is always independent of the logic function implemented in the BICMOS circuit 11 and of the number of FET devices contained therein.

The dimensions of FET devices in interface circuits C1 and C2, must be made large enough to achieve full swing under high loading conditions, but small enough to avoid extra power dissipation when one of the output bipolar transistor feeds a conductive (ON) FET.

The improved BICMOS circuit D2 of the second embodiment has an excellent testability (AC SPQL), this means that circuit D2 is tested only in DC, avoiding thereby the costly AC tests.

FIG. 6B shows another representation of circuit C2 shown in FIG. 6A. One inverter, INV2 has been moved from outside of CMOS interface circuit C2, to the inside of BICMOS logic circuit 11, without any functional or structural change.

Figure 7:
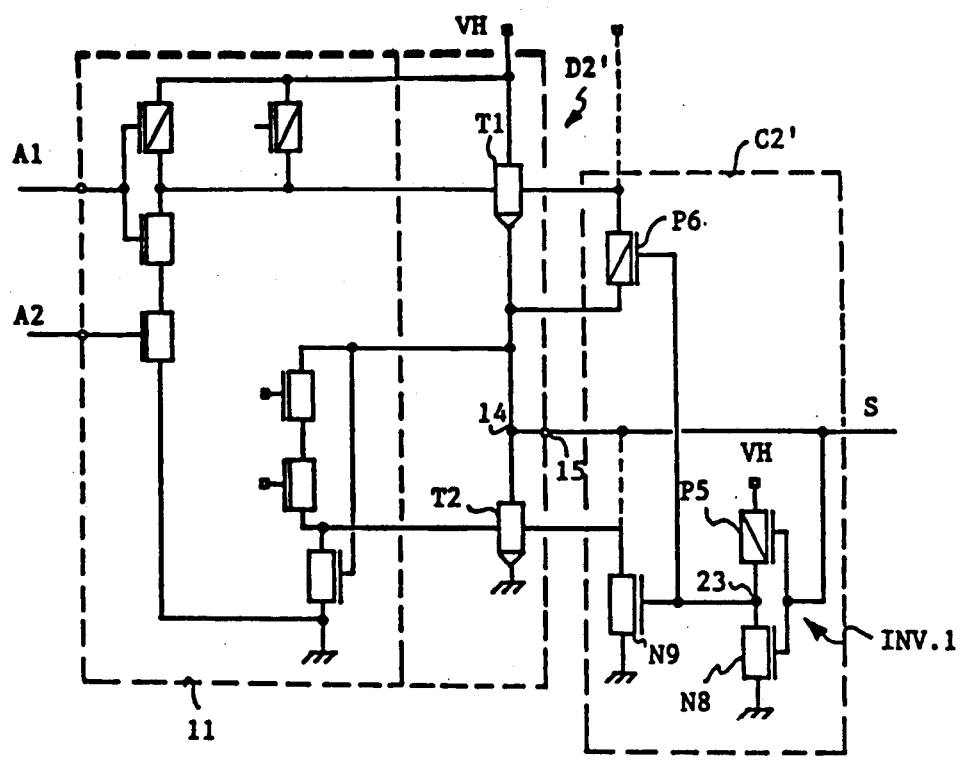
FIG. 7 illustrates a variant of the circuit of FIG. 6B.

In a variant of FIG. 6B shown in FIG. 7, the devices of INV2 have been split into two different locations of the BICMOS circuit. Using dashed connections, there is no difference in the circuits shown in FIGS. 6B and 7, but according to this variant, FETs P6 and N9 have been placed between base and emitter of bipolar transistors respectively T1 and T2. Inverter INV1 has its input connected to the potential of the output node 14 of the bipolar totempole constituted by transistors T1 and T2 at terminal 15, and gives an out of phase signal at node 23 which is delayed in the time before driving FETs P6 and N9. As a result, controlled FETs P6 or N9 are rendered conductive to terminate the full voltage swing. In that variant shown in FIG. 7, the interface circuit and the improved BICMOS circuit are referenced by C2' and D2' respectively.

All above disclosed techniques shown in FIGS. 5 to 7, permit significant reduction in the cross over current in the bipolar transistors and thus limit the power dissipation of the improved BICMOS circuits. This can be achieved because the bipolar transistor to be rendered OFF, is partially or fully shorted by a conductive FET of the CMOS interface circuit (C1, C2, C2'). In addition, because it is connected to the output node of the BICMOS circuit, it is clear that the CMOS interface circuit can be applied to any conventional BICMOS circuit 11, whatever the particular construction of both logic gate and driving blocks.

Figure 8:
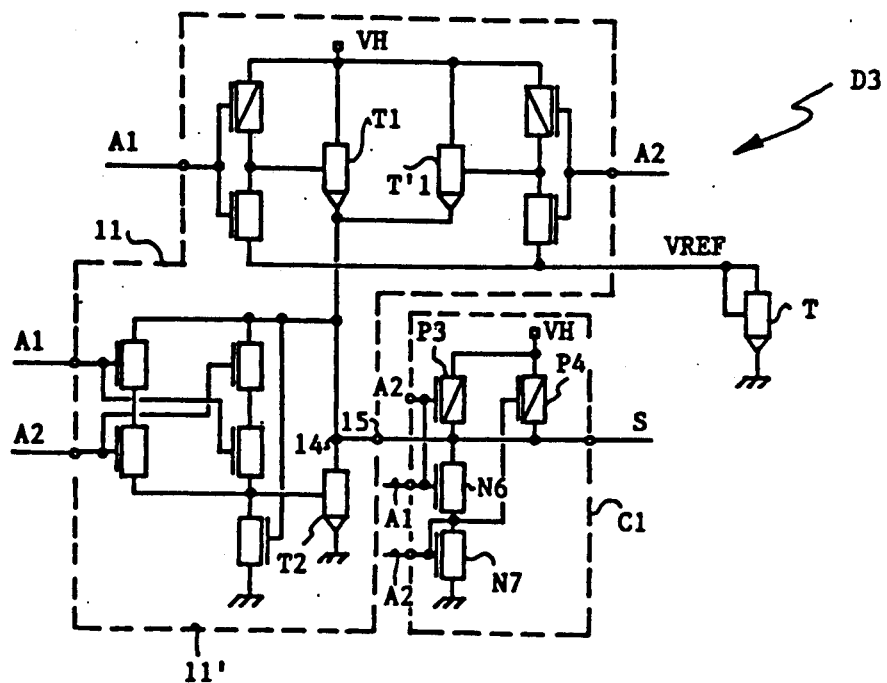
FIG. 8 illustrates another conventional BICMOS circuit of the multibase (MB) type provided with the interface circuit of FIG. 5.

FIG. 8 shows an example of a different implementation of circuit 11, when implemented with MultiBase (MB) type BICMOS circuits such as described in European patent application No. 87480020.4, filed on 1 Dec. 1987 and assigned to the same assignee as of the present invention. As shown in FIG. 8, a BICMOS logic circuit 11' of the MB type, is represented with its typical emitter dotting of NPN pull up bipolar transistors T1 and T'1 to form the common output node 14 with the NPN pull down transistor T2. Transistor T provides a reference voltage equal to one VBE, to limit the reverse voltage that is applied to the one bipolar transistor that is non conductive. The CMOS levels are obtained on the BICMOS logic circuit D3 with the CMOS interface circuit C1 of FIG. 5. FETs N6, N7, P3, P4 are placed in parallel on the output of the BICMOS circuit and provide the same logic function. The quick transitions are given by the output bipolar transistors while the last VBE to GND swing is terminated by the CMOS interface circuit C1. It can be noticed in the improved BICMOS logic circuit D3 of FIG. 8, that the CMOS interface circuit improves the rising transition of the BICMOS circuit output signal thanks to a bootstrap effect. This bootstrap effect is obtained with the emitter-base diffusion capacitance (CBE) which discharges in the top PFETs. The base node of the NPN transistor T1 is pulled above VH, which extends the bipolar effect on the transition. In the BICMOS circuit of FIG. 8, an output clamp is not necessary, as the output is tied to VH through a "ON" PFET transistor. As explained above, this solution is very efficient when the logic complexity of the BICMOS circuit is low.

Figure 9:
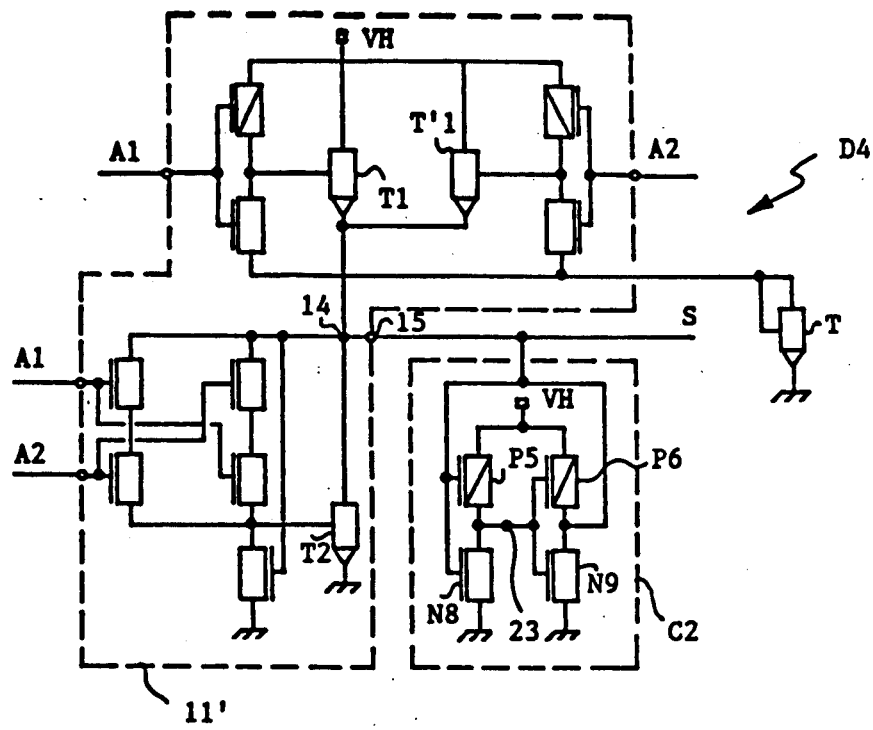
FIG. 9 illustrates the conventional BICMOS circuit of multibase type as represented in FIG. 8 provided with the interface circuit of FIG. 6A.

Now turning to FIG. 9, which illustrates the BICMOS logic circuit 11' of FIG. 8, but associated with the CMOS interface circuit C2 depicted in FIG. 6A. Interface circuit C2 consists of a latch built with FETs N8, N9, P5, P6 and is still connected to the output of the multibase BICMOS circuit 11.1. The latch gives the CMOS levels on the output node 14 of BICMOS logic circuit D4. When an input signal switches from high to low level, the output signal is switched quickly by one of the bipolar transistors T1 or T'1. This bipolar transistor charges the capacitance load and feeds a current in the NFET N9 of the latch in the ON state, to increase its drain-source voltage (VDS) from 0 to VH. At one VBE below VH, the bipolar transistors cannot drive more current and the circuit output signal S of improved circuit D4 is then pulled to VH by PFET P6 which is now turned ON while NFET N9 :s OFF. To have a good speed in such a circuit, FETs N9 and P6 have to be medium size. FETs N8 and P5 have also to be medium size to avoid a delay between the output node 14 and the common node 23 which in turn, would result in power consumption and delay increases. In the FIG. 9 circuit, an output clamp is not necessary because the output node 14 is tied to VH through the one conductive PFET of the latch. When the logic complexity of the improved BICMOS circuit is high, the silicon area for the latch is minimum. A multibase type circuit combined with a latch based interface circuit provides the fastest BICMOS logic circuits that can be built according to the teachings of the present invention.

Finally, the concept of the present invention can also be applied to different implementations of the driving block of the BICMOS logic circuit. Driving blocks can be classified in function by the nature of the output devices employed in the driving block. The four most used combinations are given below:

1. Top NPN emitter follower and bottom NPN in amplifier mode;
2. Top NPN and bottom PNP both in emitter follower (EF);
3. Top PNP and bottom NPN both in amplifier mode;
4. Top NPN Emitter follower and bottom NFET.

Figure 10:
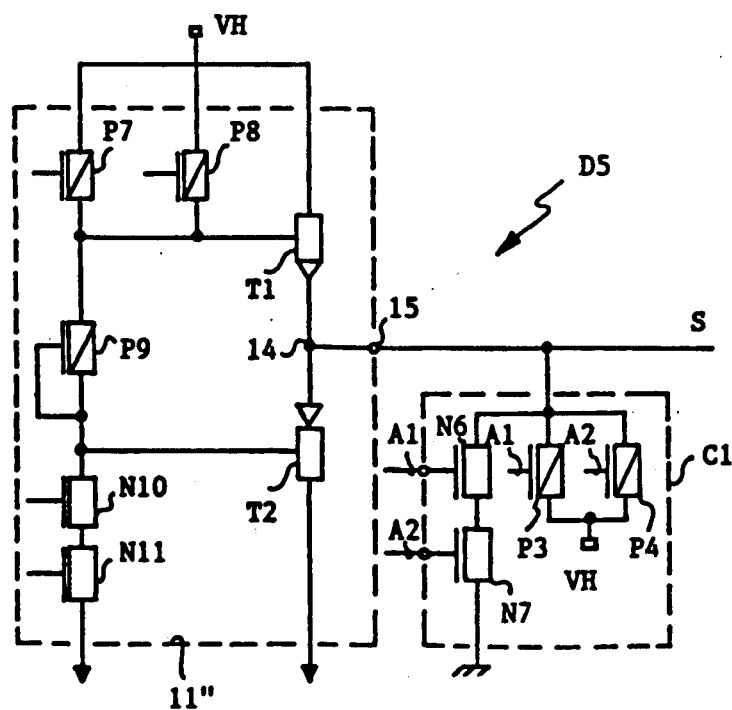
FIG. 10 illustrates still another conventional BICMOS circuit of the so called Integrated Complementary Logic (ICL) type provided with the interface circuit of FIG. 5.

As a first example, based on combination N° 2, the concept can be applied to a BICMOS logic circuit of the Integrated Complementary Logic (ICL) type using a NPN/PNP pair of transistors connected in an EF configuration. The circuit referenced 11" in FIG. 10, is described in the article: Complementary FET Bipolar Circuit, published in the IBM Technical Disclosure Bulletin, Vol. 29, No. 4, Sept. 1986, PP 1857–1858 to F. A. Montegari. The pull up logic comprised of PFETs P7 and P8 drives the pull up NPN transistor T1, while the pull down logic comprised of NFETs N10 and N11 drives the pull down PNP transistor T2. Circuit 11" further includes a PFET P9 between the base nodes of bipolar output transistors T1 and T2 to couple them in order to improve speed and reduce power comsumption. The interface circuit that has been selected is C1, for example the interface circuit described in conjunction with FIG. 5. Improved BICMOS logic circuit is referenced D5 in FIG. 10. Note that the PFETs P3 and P4 short transistor T1, while the NFETs N6 and N7 short the bottom transistor T2 to terminate the full swing of the circuit output signal.

Figure 11:
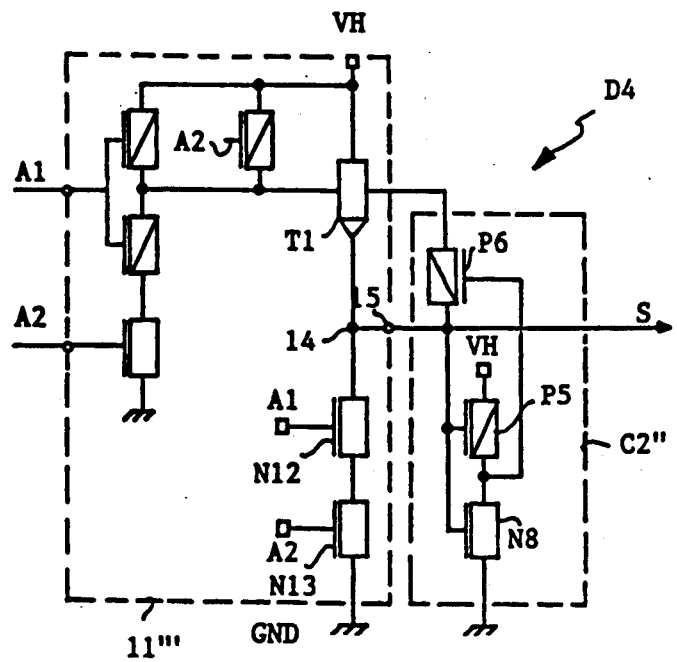
FIG. 11 illustrates still another conventional BICMOS circuit of the half BICMOS type provided with the interface circuit of FIG. 7.

Another example based on combination N° 4 is represented in FIG. 11. The concept of the present invention is applied to a conventional Half-BICMOS logic circuit as described in U.S. Pat. No. 4,558,234 assigned to Toshiba. The pull up logic is standard, while the bottom PNP transistor T2 is replaced by two NFETs N12 and N13. The BICMOS logic circuit is referenced 11'''. Due to the particular construction of circuit 11''', a variant of the CMOS interface circuit C2' shown in FIG. 7 has been employed. This variant referenced C2'', comprises only three devices, P5, P6 and N8. FET P6 controlled by the latch output signal S provides the full swing at the high level. The two NFETs N12 and N13 ensures that the output node is connected directly at GND at the low level. As a result, a full CMOS compatibility GND to VH is obtained.

In summary, the CMOS interface circuit of the present invention, can be applied to any know BICMOS logic circuit whatever the construction of the logic gate block and the driving block. It is compatible with FET devices having VTs lower than a VBE, and therefore can achieve better speed since the FET gate electrodes can receive a higher overdrive. Electrical simulations predict a 40% speed improvement for a 2 W NAND with respect to the conventional circuit. It can be mixed with regular CMOS logic since the voltage swing is from GND to VH.

Figure 12:
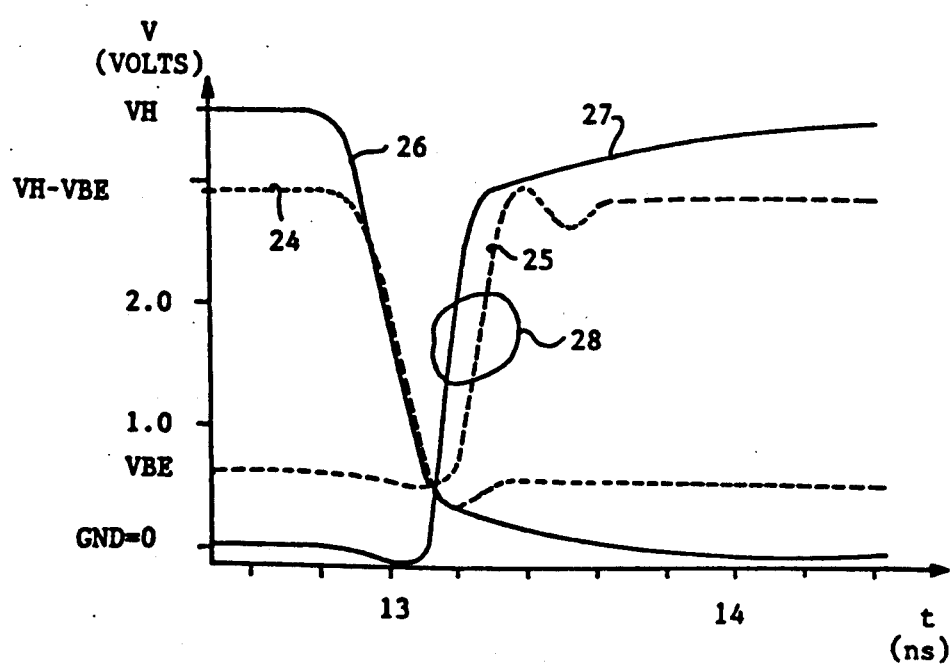
FIG. 12 illustrates a comparison of simulated waveforms of both input and output signals for the conventional BICMOS circuit of FIG. 1 and for the improved BICMOS logic circuit of the present invention (embodiment shown in FIG. 6A).

FIG. 12 shows the waveforms of input/output signals of a conventional BICMOS circuit as shown in FIG. 1 compared to those of the improved BICMOS circuit shown in FIG. 5. A conventional BICMOS circuit driven by a partial swing voltage (curve 24) supplies a partial swing voltage at its output (curve 25). The improved BICMOS circuit of the present invention, when driven by a full swing voltage (curve 26) supplies a full swing output signal (curve 27). The difference in delays that can be noticed in the response, appears clearly in zone 28. The delay of the full swing BICMOS output signal could even be shorter in the rising (falling) transition, if low VT PFETs are employed in the improved BICMOS circuit of the present invention.

Only a few examples of implementation of the present invention in the most known BICMOS circuits have been given in the preceding figures. A two-input NAND gate has been chosen to implement the logic function of the BICMOS circuit, however, it must be understood that more complex logic functions S=f(A1, A2, ...) can be implemented as well to build complete families of improved BICMOS logic circuits.

What is claimed is:

1. A BICMOS logic circuit biased between first and second supply voltages, comprising:
   a CMOS logic circuit driven by a plurality of logic input signals;
   a driving circuit connected to said CMOS logic circuit and including first and second bipolar transistors connected in series with an output node therebetween for providing an output signal on said output node; and
   interface circuit means comprised of at least one pair of CMOS transistors connected to said first and second supply voltages for forcing said output signal to swing fully between said first and second supply voltages responsive to said logic input signals.

2. The BICMOS logic circuit of claim 1, wherein said CMOS logic circuit is of the ICL type.

3. The BICMOS logic circuit of claim 1 wherein said first supply voltage is a positive voltage and said second supply voltage is the ground and wherein said interface circuit means is comprised of CMOS FETs that become active at least in one of the positive voltage to VBE or (positive voltage-VBE) to VH ranges.

4. The BICMOS logic circuit of claim 1, wherein said interface circuit means comprises two cross coupled inverters forming a latch, the feed back loop of said latch being connected to said output node.

5. The BICMOS logic circuit of claim 1, wherein said interface circuit means performs the same logic function and is driven by the same logic input signals as said CMOS logic circuit.

6. The BICMOS logic circuit of claim 5, wherein said CMOS logic circuit is of the Multi Base type.

7. The BICMOS logic circuit of claim 5, wherein said CMOS logic circuit comprises an upper part circuit connected to drive said first bipolar transistor and a lower part circuit to connected drive said second bipolar transistor.

8. The BICMOS logic circuit of claim 7, wherein said interface circuit means is the duplication of said upper part circuit.

9. A BICMOS logic circuit biased between first and second supply voltages, comprising:
   a CMOS logic circuit driven by a plurality of logic input signals;
   a driving circuit connected to said CMOS logic circuit and including at least one bipolar transistor connected to an output node for providing an output signal on said output node; and
   interface circuit means including at least two pairs of CMOS transistors connected as first and second cross coupled inverters to form a latch with the feedback loop of said latch connected to said output node for forcing said output signal to swing fully between said first and second supply voltages responsive to said logic input signals.

10. The BICMOS logic circuit of claim 9, wherein said driving circuit, comprises first and second bipolar transistors connected in series with said output node connected therebetween.

11. The BICMOS logic circuit of claim 9, wherein said CMOS logic circuit is of the Multi Base type.

12. The BICMOS logic circuit of claim 9, wherein the said CMOS logic circuit is of the ICL type.

13. The BICMOS logic circuit of claim 9, wherein two CMOS FETs form one of said inverters, said two CMOS FETs being positioned such that one PFET is connected in parallel with the base-emitter junction of said first bipolar transistor, and one NFET is connected in parallel with the base-emitter junction of said second transistor.

* * * * *